(12) United States Patent
Li

(10) Patent No.: US 10,388,573 B2
(45) Date of Patent: Aug. 20, 2019

(54) FIN-FET DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 9 days.

(21) Appl. No.: 15/783,854

(22) Filed: Oct. 13, 2017

(65) Prior Publication Data

US 2018/0108573 A1   Apr. 19, 2018

(30) Foreign Application Priority Data

Oct. 18, 2016   (CN) .......................... 2016 1 0908755

(51) Int. Cl.
| | |
|---|---|
| *H01L 21/8238* | (2006.01) |
| *H01L 27/092* | (2006.01) |
| *H01L 21/265* | (2006.01) |
| *H01L 21/324* | (2006.01) |

(Continued)

(52) U.S. Cl.
CPC ........ *H01L 21/823814* (2013.01); *H01L 21/26513* (2013.01); *H01L 21/324* (2013.01); *H01L 21/823821* (2013.01); *H01L 21/823878* (2013.01); *H01L 27/0924* (2013.01);
(Continued)

(58) Field of Classification Search
USPC ........................................... 257/369
See application file for complete search history.

(56) References Cited

U.S. PATENT DOCUMENTS 9,461,110 B1* 10/2016 Wang .................. H01L 29/0649
2009/0227083 A1* 9/2009 Holz ................... H01L 29/0653
                                                             438/294
2014/0361373 A1  12/2014 Hung et al.
(Continued)

OTHER PUBLICATIONS

The European Patent Office (EPO) The Extended European Search Report for 17196522.1 dated Mar. 13, 2018 8 Pages.

*Primary Examiner* — Zandra V Smith
*Assistant Examiner* — Lawrence C Tynes, Jr.
(74) *Attorney, Agent, or Firm* — Anova Law Group, PLLC

(57) ABSTRACT

A method for fabricating a Fin-FET device includes providing a base structure and a plurality of fin structures protruding from the base structure. Along a direction perpendicular to the surface of the base structure and from the bottom to the top of each fin structure, the width of the fin structure perpendicular to the length direction of the fin structure decreases. The method further includes forming a gate structure on the base structure across each fin structure and covering a portion of top and sidewall surfaces of the fin structure, and removing a portion of the fin structure on each side of the gate structure to form a trench in the fin structure. Along the length direction of the fin structure, the bottom width of the trench is smaller than the top width of the trench. The method also includes filling each trench with a doped source/drain epitaxial layer.

19 Claims, 4 Drawing Sheets

(51) Int. Cl.
*H01L 29/66* (2006.01)
*H01L 29/78* (2006.01)

(52) U.S. Cl.
CPC .... *H01L 29/66795* (2013.01); *H01L 29/7848* (2013.01); *H01L 29/7853* (2013.01)

(56) References Cited

U.S. PATENT DOCUMENTS

| | | | |
|---|---|---|---|
| 2015/0035023 A1* | 2/2015 | Kim | H01L 29/785 257/288 |
| 2015/0200271 A1* | 7/2015 | Lee | H01L 29/66795 257/401 |
| 2015/0221654 A1 | 8/2015 | Kim et al. | |
| 2015/0318354 A1 | 11/2015 | Yin et al. | |
| 2016/0284837 A1 | 9/2016 | Kim et al. | |
| 2016/0293750 A1 | 10/2016 | Kim et al. | |

* cited by examiner

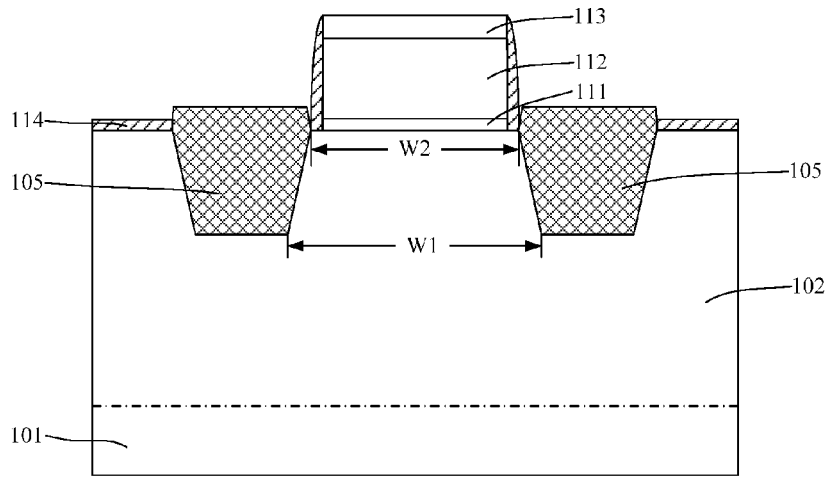

FIG. 8

| Providing a base structure and a plurality of fin structures protruding from the surface of the base structure, along a direction perpendicular to the surface of the base structure and from the bottom to the top of each fin structure, the width of the fin structure perpendicular to the length direction becoming smaller | S201 |

| Forming a gate structure on the base structure across each fin structure | S202 |

| Forming a trench on each side of the gate structure by removing a portion of the fin structure, the trench having a bottom width smaller than a top width along the length direction of the fin structure | S203 |

| Forming a doped source/drain epitaxial layer in each trench | S204 |

FIG. 9

FIN-FET DEVICES AND FABRICATION METHODS THEREOF

CROSS-REFERENCES TO RELATED APPLICATIONS

This application claims the priority of Chinese Patent Application No. CN201610908755.0, filed on Oct. 18, 2016, the entire content of which is incorporated herein by reference.

FIELD OF THE DISCLOSURE

The present disclosure generally relates to the field of semiconductor fabrication technology and, more particularly, relates to fin field-effect transistors and fabrication methods thereof.

BACKGROUND

With continuous development of semiconductor technology, the development of the semiconductor process node demonstrates a growing trend to fall off the Moore's law. In order to accommodate the decrease of the process node, the channel length in metal-oxide-semiconductor field-effect transistor (MOSFET) has to be reduced. Reducing the channel length may benefit the increase of transistor density on the semiconductor chip and may also be conducive to improving the switching speed of the MOSFET.

However, as the channel length in devices decreases, the distance between the source region and the drain region of the device is also reduced. As such, the controllability of the gate electrode on the channel may be degraded and the gate voltage may not be able to pinch off the channel. As a result, the subthreshold leakage phenomenon, e.g. the short-channel effect (SCE), may easily occur.

Therefore, in order to meet the requirements raised by scaling down the size of the devices, semiconductor technology is gradually shifted away from conventional planar MOSFET to more efficient three-dimension (3D) transistor, such as fin field-effect-transistor (Fin-FET). In a Fin-FET device, the gate may be able to control an ultra-thin structure (e.g. fin structure) from at least two sidewall surfaces of the structure. Therefore, Fin-FET devices may demonstrate much stronger gate-to-channel controllability than planar MOSFETs, and thus may efficiently suppress the SCE. Moreover, compared to some other devices, Fin-FET devices may demonstrate better compatibility with existing manufacturing technology for integrated circuits.

However, the existing Fin-FET devices and fabrication methods may still need to be improved. The disclosed Fin-FET device and the fabrication methods are directed to solve one or more problems set forth above and other problems in the art.

BRIEF SUMMARY OF THE DISCLOSURE

One aspect of the present disclosure includes a method for fabricating a Fin-FET device. The method for fabricating the Fin-FET device includes providing a base structure and a plurality of fin structures protruding from the base structure. Along a direction perpendicular to the surface of the base structure and from the bottom to the top of each fin structure, the width of the fin structure perpendicular to the length direction of the fin structure decreases. The method further includes forming a gate structure on the base structure across each fin structure and covering a portion of top and sidewall surfaces of the fin structure, and removing a portion of the fin structure on each side of the gate structure to form a trench in the fin structure. Along the length direction of the fin structure, the bottom width of the trench is smaller than the top width of the trench. The method for fabricating the Fin-FET device also includes filling each trench with a doped source/drain epitaxial layer.

Another aspect of the present disclosure provides a Fin-FET device. The Fin-FET device includes a base structure and a plurality of fin structures protruding from the base structure. Along a direction perpendicular to the surface of the base structure and from the bottom to the top of each fin structure, the width of the fin structure perpendicular to the length direction of the fin structure decreases. The Fin-FET device further includes a gate structure formed on the base structure across each fin structure and covering a portion of the top and the sidewall surfaces of the fin structure, and a doped source/drain epitaxial layer formed in the fin structure on both sides of the gate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 2-8 illustrate schematic cross-section views of semiconductor structures at certain stages of an exemplary fabrication process consistent with various disclosed embodiments of the present disclosure; and FIG. 9 illustrates a flowchart of an exemplary fabrication method for a Fin-FET device consistent with various disclosed embodiments of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
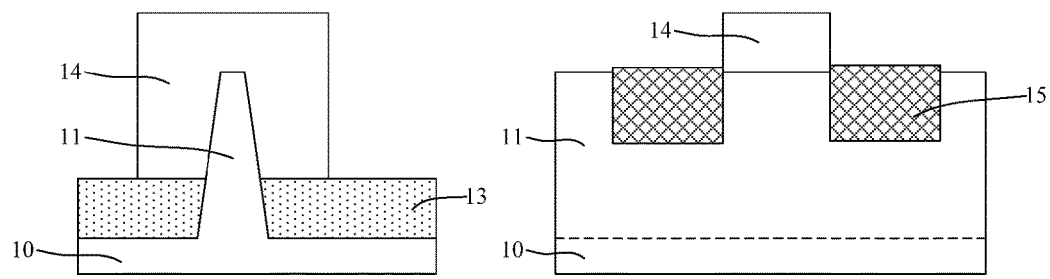
FIG. 1 illustrates schematic cross-section views of a Fin-FET device.

FIG. 1 illustrates schematic cross-section views of a Fin-FET device. Specifically, the left panel of FIG. 1 illustrates a schematic cross-section view of the Fin-FET device along a direction perpendicular to the length direction of the fin structure in the Fin-FET device, and the right panel of FIG. 1 illustrates a schematic cross-section view of the Fin-FET device along the length direction of the fin structure.

Referring to FIG. 1, the Fin-FET includes a substrate 10, a fin structure 11 protruding from the substrate 10, and an isolation structure 13 formed on the substrate 10. The isolation structure 13 covers a portion of each sidewall surface of the fin structure 11, and the top surface of the isolation structure 13 is lower than the top surface of the fin structure 11. The Fin-FET device also includes a gate structure 14 formed on the isolation structure 13 across the fin structure 11, two trenches formed in the fin structure 11 on the two opposite sides of the gate structure 14, and an epitaxial layer filling up each trench. Moreover, the cross section of each trench has a U shape or a square shape.

The fabrication process for the fin structure 11 may affect the width of the fin structure 11, leading to a gradually decreased width of the fin structure 11 along the direction perpendicularly from the surface of the substrate 10 to the top of the fin structure 11. Specifically, the width of the fin structure 11 refers to the dimension of the fin structure 11 along a direction perpendicular to the length direction of the fin structure 11 and parallel to the surface of the substrate 10. Therefore, the dimension of the fin structure 11 along the direction perpendicular to the length direction of the fin structure 11 and parallel to the surface of the substrate 10 gradually increases as moving away from the surface of the substrate 10. Accordingly, along the direction perpendicularly from the surface of the substrate 10 to the top of the fin structure 11, the ability of gate structure 14 to control the channel region in the fin structure 11 gradually decreases. Thus, the SCE may more likely appear in the portion of the channel region close to the bottom of each trench as compared to in the portion of the channel region closed to the top of the trench. Moreover, drain induced barrier lowering (DIBL) may also be more prominent in the portion of the channel region closed to the bottom of the trench as compared to in the portion of the channel region corresponding to the top of the trench.

The present disclosure provides Fin-FET devices and methods for fabricating Fin-FET devices to solve the SCE problem and reduce the DIBL effect. FIG. 9 illustrates a flowchart of an exemplary fabrication method for a Fin-FET device consistent with various disclosed embodiments of the present disclosure. FIGS. 2-8 illustrate schematic cross-section views of semiconductor structures at certain stages of the fabrication method.

Figure 2:
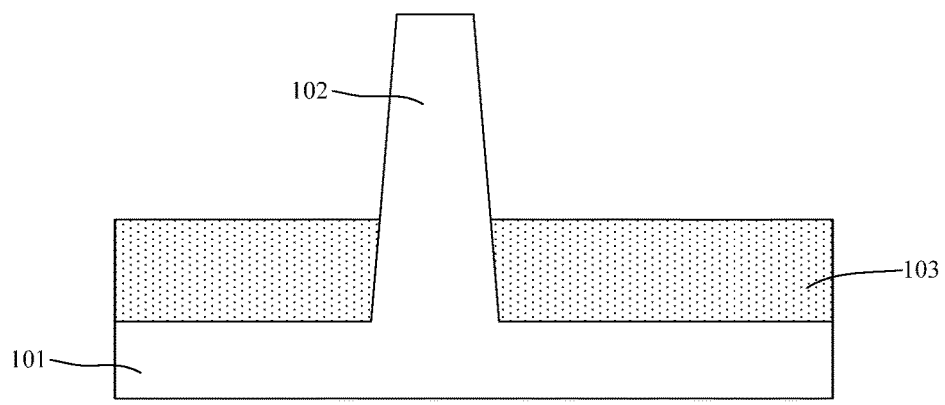

Referring to FIG. 9, at the beginning of the fabrication process, a base structure including a substrate and a plurality of fin structures protruding from the substrate may be provided (S201). FIG. 2 illustrates a schematic cross-section view of a corresponding semiconductor structure.

Referring to FIG. 2, a base structure including a plurality of protruding fin structures 102 may be provided. The base structure may also include a substrate 101 and an isolation structure 103 formed on the substrate 101. The plurality of fin structures 102 may be formed on the substrate 101. For illustration purpose, FIG. 2 shows only one fin structure 102. However, the number of the fin structures 102 may be more than one.

The isolation structure 103 may cover a portion of the sidewall surfaces of each fin structure 102, and the top surface of the isolation structure 103 may be lower than the top surfaces of the fin structures 102. The isolation structure 103 may electrically isolate neighboring fin structures 102.

The substrate 101 may be made of silicon, germanium, SiGe, SiC, GaAs, InAs, or any other appropriate semiconductor material. The substrate 101 may also be made of silicon on insulator (SOI) or germanium on insulator (GOI). The fin structures 102 may be made of silicon, germanium, SiGe, SiC, GaAs, InAs, or any other appropriate semiconductor material. The isolation structure 103 may be made of $SiO_x$, $SiN_x$, SiON, or any other appropriate material. In one embodiment, the substrate 101 and the fin structures 102 are both made of silicon, and the isolation structure 103 is made of $SiO_x$.

In one embodiment, the substrate 101 and the plurality of fin structures 102 protruding from the substrate 101 may be formed by a process including the following steps. First, an initial substrate may be provided. A patterned layer may be formed on the surface of the initial substrate. Further, the initial substrate may be etched by using the patterned layer as an etch mask. After etching, the initial substrate may become the substrate 101, and the plurality of protrusions formed on the substrate may become the fin structures 102. After forming the plurality of fin structures 102, the patterned layer may then be removed.

In one embodiment, the patterned layer may be formed by a process including the following steps. An initial patterned film may be formed on the surface of the initial substrate. A patterned photoresist layer may then be formed on the initial patterned film. The initial patterned film may be etched by using the patterned photoresist layer as an etch mask. As such, the patterned layer may be formed on the surface of the initial substrate from the initial patterned film. Further, the patterned photoresist layer may be removed. In one embodiment, the process to form the patterned layer may also include a self-aligned double patterned (SADP) process, a self-aligned triple patterned (SATP) process, or a self-aligned double double patterned process. The SADP process may further include a litho-etch-litho-etch process or a litho-litho-etch process.

The process to form the isolation structure 103 may include the following steps. First, an isolation film may be formed on the substrate 101 to cover the fin structures 102. The top surface of the isolation film may be higher than the top surfaces of the fin structures 102. A planarization process may then be performed on the top surface of the isolation film. After the planarization process, a surface portion of the isolation film may be removed by etching. As such, the isolation structure 103 may be formed on the substrate 101.

In one embodiment, along a direction perpendicular to the surface of the substrate 101 and from the bottom to the top of the fin structure 102, the width of the fin structure 102, i.e. the dimension of the fin structure 102 along a direction perpendicular to the length direction of the fin structure 102 and parallel to the surface of the substrate 101, may gradually decrease. The variation in the width of the fin structures 102 is mainly attributed to the characteristics of the etching process. Specifically, during the etching process to form the fin structures 102, etching byproducts may be generated, and a portion of the etching byproducts may regather at the bottom of the fin structure 102 under the action of gravity. Accordingly, during the etching process, the etch rate on the region where the etching byproducts regather may be relatively small. As a result, the bottom width of the formed fin structure 102 may be larger than the top width of the fin structure 102.

For example, along a direction perpendicular to the length direction of the fin structure 102 and parallel to the substrate 101, the bottom width of the fin structure 102 is larger than the top width of the fin structure 102.

Figure 3:
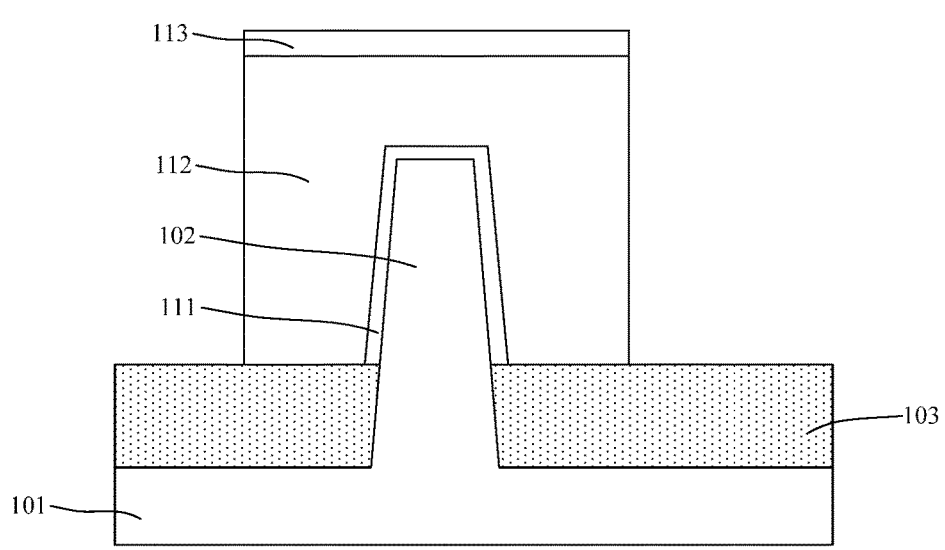
Figure 4:
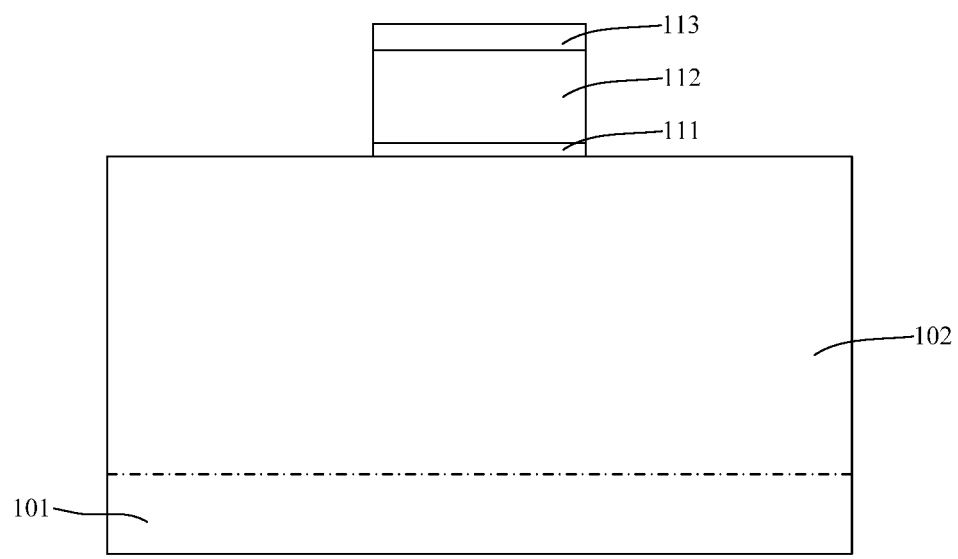

Further, returning to FIG. 9, a gate structure may be formed on the base structure across each fin structure (S202). FIG. 3 and FIG. 4 illustrate schematic cross-section views of a corresponding semiconductor structure. Specifically, FIG. 3 illustrates a schematic cross-section view developed from the cross-section view shown in FIG. 2. FIG. 4 illustrates a schematic cross-section view of the semiconductor structure shown in FIG. 3 along the length direction of the fin structure.

Referring to FIG. 3 and FIG. 4, a gate structure may be formed on the base structure across each fin structure 102. The gate structure may cover a portion of the top and the sidewall surfaces of the fin structure 102.

In one embodiment, the gate structure includes a gate dielectric layer 111 and a gate electrode layer 112 formed on the gate dielectric layer 111. The gate dielectric layer 111 may be made of a high-k dielectric material. The high-k dielectric material may refer to dielectric material with a dielectric constant greater than that of SiO$_2$. Specifically, the high-k dielectric material may include HfO$_2$, HfSiO, HfSiON, HfTaO, HfTiO, HfZrO, ZrO$_2$, Al$_2$O$_3$, etc. The gate electrode layer 112 may be made of polycrystalline silicon or a metal material. The metal material may include one or more of Ti, Ta, TiN, TaN, TiAl, TiAlN, Cu, Al, W, Ag, and Au.

In one embodiment, an interfacial layer may also be formed between the gate dielectric layer 111 and the fin structure 102. The interfacial layer may be made of SiO$_x$.

The gate structure may be formed by a process including the following steps. First, a dielectric film may be formed on the isolation structure 103. The dielectric film may be formed across the fin structure 102 and cover the top and the sidewall surfaces of the fin structure 102. A gate electrode film may then be formed on the dielectric film. Further, a hard mask layer 113 may be formed on the gate electrode film. The hard mask layer 113 may define the pattern of the subsequently-formed gate structure. The gate electrode film and the dielectric film may then be patterned by using the hard mask layer 113 as a mask. As such, the gate dielectric layer 111 and the gate electrode layer 112 on the gate dielectric layer 111 may be formed.

In one embodiment, the hard mask layer 113 on the gate structure may be retained after forming the gate structure so that the hard mask layer 113 may provide protection for the top surface of the gate structure during the subsequent fabrication process. The hard mask layer 113 may be made of SiN$_x$, SiON, SiC, or BN.

Figure 5:
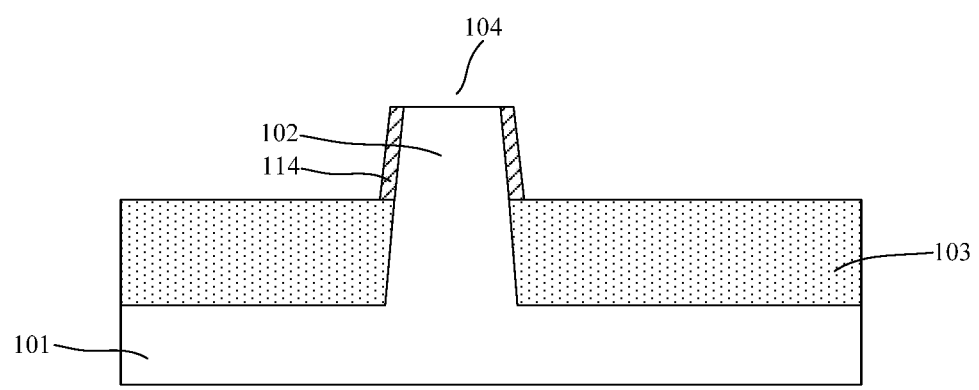
Figure 6:
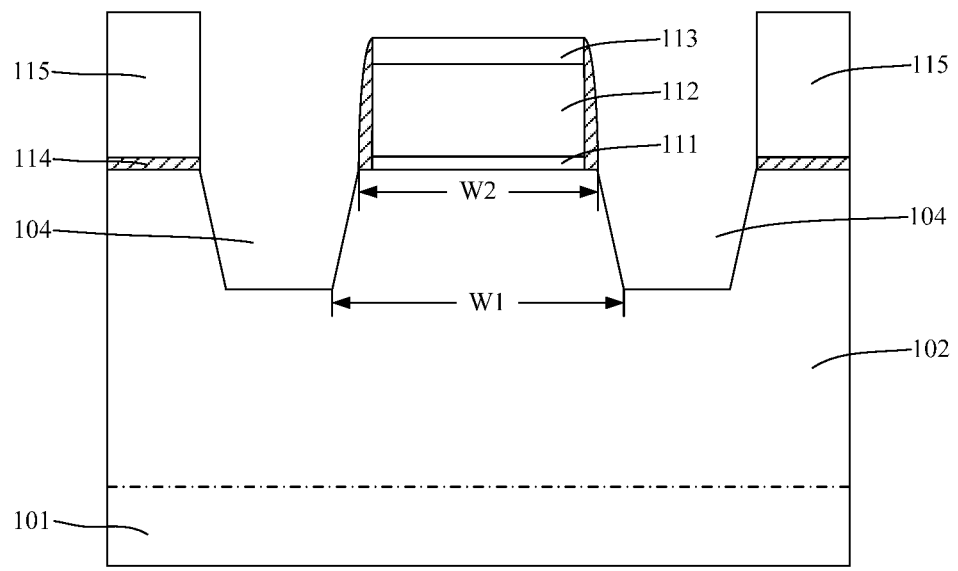

Returning to FIG. 9, further, a portion of the fin structure on the each side of the gate structure may be removed to form a trench with a bottom width of the trench smaller than a top width of the trench along the length direction of the fin structure (S203). FIG. 5 and FIG. 6 illustrate schematic cross-section views of a corresponding semiconductor structure. Specifically, FIG. 5 illustrates a schematic cross-section view of the semiconductor structure along a direction perpendicular to the length direction of the fin structure, and FIG. 6 illustrates a schematic cross-section view developed from the cross-section view shown in FIG. 4.

Referring to FIG. 5 and FIG. 6, a portion of the fin structure 102 on each side of the gate structure may be removed to form a trench 104 through an etching process. Along the length direction of the fin structure 102, the trench 104 formed after the etching process may have a bottom width smaller than a top width.

The trench 104 on each side of the gate structure may be formed by a process including the following steps. First, a mask layer 114 may be formed on the top and the sidewall surfaces of the fin structure 102, the top and sidewall surfaces of the gate structure, as well as the base structure. A patterned layer 115 may then be formed on the mask layer 114. The patterned layer 115 may expose a portion of the mask layer 114 formed on the top surface of the fin structure 102 on each side of the gate structure. Further, the exposed portion of the mask layer 114 and a portion of the fin structure 102 may be etched by using the patterned layer 115 as an etch mask. As such, a trench 104 may be formed on each side of the gate structure.

During the etching process to remove the portion of the fin structure 102, the portion of the mask layer 114 formed on the removed portion of the fin structure 102 may also be removed. In other embodiment, during the etching process to remove the portion of the fin structure, the portion of the mask layer formed on the sidewall surfaces of the removed portion of the fin structure may not be removed, and thus the portion of the mask layer may become two opposite sidewalls for the formed trench.

The patterned layer 115 may be formed on the portion of the fin structure 102 not expected to be etched such that the corresponding portion of the fin structure 102 may not be etched. In one embodiment, because the top surface of the gate electrode layer 112 is protected by the hard mask layer 113, the patterned layer 115 may also expose the hard mask layer 113 formed on the top of the gate structure.

The mask layer 114 may be made of a material different from the material used to form the fin structure 102. In one embodiment, the mask layer 114 is made of SiN$_x$. In other embodiment, the mask layer 114 may also be made of SiCN, SiON, or BN.

The patterned layer 115 may be made of a photoresist. After forming the trench 104 on each side of the gate structure, the patterned layer 115 may be removed. The patterned layer 115 may be removed by a wet etching or an ashing process.

The portion of the fin structure 102 on each side of the gate structure may be removed by a dry etching process or a wet etching process to form the trench 104.

In one embodiment, along a direction perpendicular to the surface of the base structure and parallel to the length direction of the fin structure 102, the cross section of each trench may have a reversed trapezoid shape. Therefore, along a direction parallel to the surface of the substrate 101, a first width W1 between the bottom edges of the two trenches 104 formed on the two opposite sides of the gate structure may be larger than a second width W2 between the top edges of the two trenches 104.

In a subsequent process, each trench 104 may be filled with a doped source/drain epitaxial layer. Specifically, a doped source/drain epitaxial layer formed on one side of the gate structure may become a source region, and accordingly, another doped source/drain epitaxial layer formed on the other side of the gate structure may become a drain region, and vice versa. Therefore, in a region close to the top surface of the fin structure 102, the distance between the source region and the drain region may be relatively small, leading to an increased driving current for the Fin-FET device. Moreover, in a region away from the top surface of the fin structure 102, the distance between the source region and the drain region may be relatively large, leading to an increased effective channel length. Therefore, the problems due to insufficient ability of the gate structure in controlling the channel region may be balanced. For example, the SCE in the Fin-FET device may be overcome.

In other embodiment, along the direction perpendicular to the surface of the base structure and parallel to the length direction of the fin structure, the cross-section of each trench may also have a reversed triangle shape.

Figure 7:
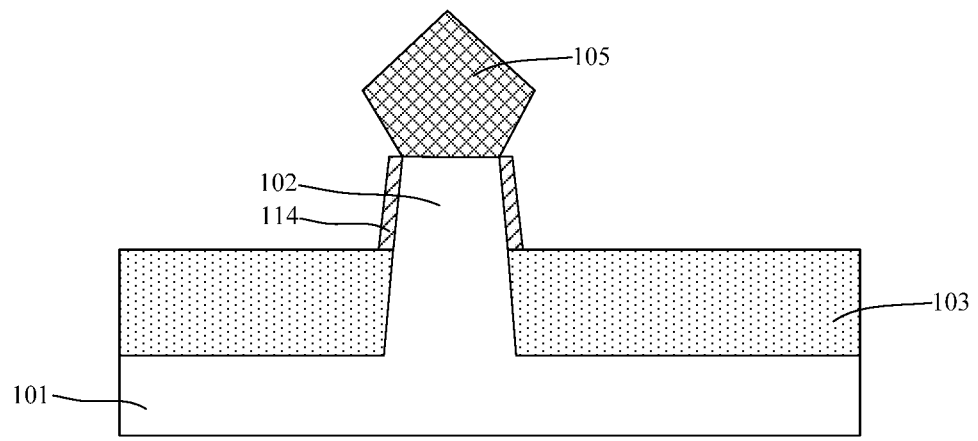

Further, returning to FIG. 9, a doped source/drain epitaxial layer may be formed in each trench (S204). FIG. 7 and FIG. 8 illustrate schematic cross-section views of a corresponding semiconductor structure. Specifically, FIG. 7 illustrates a schematic cross-section view developed from the cross-section view shown in FIG. 5 and FIG. 8 illustrates a schematic cross-section view developed from the cross-section view shown in FIG. 6.

Referring to FIG. 7 and FIG. 8, each trench 104 (referring to FIG. 5 and FIG. 6) may be filled to form a doped source/drain epitaxial layer 105. The doped source/drain epitaxial layer 105 may be doped by P-type ions or by N-type ions.

In one embodiment, the doped source/drain epitaxial layer 105 may be formed by a selective epitaxial process. Further, because the surface of the fin structure 102, except the portion exposed in the two trenches 104, may be covered by the mask layer 114, and the lattice constant of the material used to form the mask layer 114 may be significantly different from the lattice constant of the material used to form the doped source/drain epitaxial layer 105, epitaxial growth of film in undesired region may be avoided. That is, the doped source/drain epitaxial layer 105 may only be formed in the two trenches 104.

Further, a doped source/drain epitaxial layer 105 on one side of the gate structure may be used as a source region, and accordingly, another doped source/drain epitaxial layer on the other side of the gate structure may be used as a drain region, and vice versa. When the Fin-FET device to be formed in an N-type metal-oxide-semiconductor (NMOS) device, the doped source/drain epitaxial layer 105 may be made of Si or SiC and doped with N-type ions. The N-type ions may include one or more of P ions, As ions, and Sb ions. When the Fin-FET device to be formed in a P-type metal-oxide-semiconductor (PMOS) device, the doped source/drain epitaxial layer 105 may be made of Si or SiGe and doped with P-type ions. The P-type ions may include one or more of B ions, Ge ions, and In ions.

Moreover, when the doped source/drain epitaxial layer 105 is made of SiC, the doped source/drain epitaxial layer 105 may also be able to exert stress to the channel region, and thus improve the mobility of the carriers in the NMOS device. When the doped source/drain epitaxial layer 105 is made of SiGe, the doped source/drain epitaxial layer 105 may also be able to provide stress to the channel region, and thus improve the mobility of the carriers in the PMOS device.

In one embodiment, the doped source/drain epitaxial layer 105 may be formed by in-situ doping of the P-type ions or the N-type ions during the selective epitaxial process. In order to improve the quality of the formed doped source/drain epitaxial layer 105, prior to forming the doped source/drain epitaxial layer 105, the fabrication process may also include forming an epitaxial seed layer on the bottom and the sidewall surfaces of each trench 104. The epitaxial seed layer may be made of Si.

In one embodiment, the top surface of the doped source/drain epitaxial layer 105 may be higher than the top opening of the trench 104 (referring to FIG. 5 and FIG. 6). In other embodiment, the top surface of the doped source/drain epitaxial layer 105 may also be leveled with the top opening of the trench 104.

After forming the doped source/drain epitaxial layer 105, the doped source/drain epitaxial layer 105 may be further doped through a doping process. The doping ions used in the doping process may be the same as the type of the doping ions in the doped source/drain epitaxial layer 105.

The doping process may be conducive to reducing the contact resistance at the surface of the doped source/drain epitaxial layer 105. In addition, the doping process may also further improve the doping concentration in the source region as well as the drain region.

Moreover, the doping depth in the doping process may not be too large. This is mainly because that when the doping depth in the doping process is too large, the source region near the bottom of the corresponding trench 104 may become closer to the drain region near the bottom of the corresponding trench 104, and the boundary of the source region as well as the boundary of the drain region may not be defined by the corresponding trench 104. Therefore, in a region adjacent to the bottom of the trenches 104, the distance between the source region and the drain region may become smaller, and thus the effective channel length in the region adjacent to the bottom of the trenches 104 may become smaller. In addition, because the ability of the gate structure to control the channel region adjacent to the bottom of the trenches 104 may be undesired, the SCE in the region adjacent to the bottom of the trenches 104 may not be reduced. In one embodiment, the doping depth of the doping process is smaller than or equal to $\frac{1}{3}$ of the depth of the trenches 104.

After performing the doping process, the fabrication process may further include performing an annealing process on the doped source/drain epitaxial layers 105.

In one embodiment, along the direction perpendicular to the surface of the base structure and from the bottom to the top of each trench 104, the width of the fin structure 102 may gradually decrease. That is, in the direction perpendicular to the length direction of the fin structure 102 and parallel to the surface of the substrate 101, the width of the fin structure 102 at the top of the trench 104 may be smaller than the width of the fin structure 102 at the bottom of the trench 104.

The width of the fin structure 102 refers to the dimension of the fin structure 102 along the direction perpendicular to the length direction of the fin structure 102 and parallel to the surface of the substrate 101. Therefore, in the region close to the tops of the trenches 104, the dimension of the fin structure 102 along the direction perpendicular to the length direction of the fin structure 102 and parallel to the surface of the substrate 101 may be relatively small, and accordingly, the ability of the gate structure to control the channel region between the tops of the adjacent trenches 104 may be strong. Moreover, because the distance between the tops of the adjacent trenches 104 is relatively small, the distance between the tops of the doped source/drain epitaxial layers 105 on the two opposite sides of the gate structure may also be relatively small, which may be conducive to improving the driving current for the Fin-FET device.

In the region adjacent to the bottoms of the trenches 104, the dimension of the fin structure 102 along the direction perpendicular to the length direction of the fin structure 102 and parallel to the surface of the substrate 101 may be relatively large, and accordingly, the ability of the gate structure to control the channel region between the bottoms of the two adjacent trenches 104 may be weak. Moreover, because the distance between the bottoms of the two adjacent trenches 104 is relatively large, the distance between the bottoms of the doped source/drain epitaxial layers 105 may also be large, which may be conducive to increasing the effective channel length between the bottoms of the two adjacent trenches 104. As such, the weak ability of the gate structure in controlling the channel region may be compensated, and thus, the SCE may be suppressed.

Further, along the direction from the top to the bottom of the trench 104, the width of the fin structure 102, i.e. the dimension of the fin structure 102 along the direction perpendicular to the length direction of the fin structure 102, may gradually increase, and accordingly, the ability of the gate structure to control the channel region between the two adjacent trenches 104 may gradually decrease. Moreover, the cross-section of the trench 104 may have a reversed trapezoid shape. Therefore, as the width of the fin structure 102 between adjacent trenches 104 gradually increases along the direction from the top of the trench 104 to the bottom of the trench 104, the distance between the doped source/drain epitaxial layers 105 on the two opposite sides of the gate structure may also gradually increase. Therefore, undesired effects due to gradually weakened ability of the gate structure in controlling the channel region between two adjacent trenches 104 along the direction from the top to the bottom of the fin structure 102 may be reduced. As such, without changing the driving current for the Fin-FET device, the SCE may be suppressed.

Further, corresponding to the fabrication method described above, the present disclosure also provides a Fin-FET device. FIG. 7 and FIG. 8 illustrate schematic cross-section views of an exemplary Fin-FET device consistent with various embodiments of the present disclosure.

Referring to FIG. 7 and FIG. 8, the Fin-FET device may include a base structure and a plurality of fin structures 102 protruding from the base structure. For illustration purpose, only one fin structure 102 is shown in FIG. 7 and FIG. 8. However, the number of the fin structures 102 may be more than one. Moreover, along the direction perpendicular to the surface of the base structure and from the bottom to the top of the fin structure 102, the width of the fin structure 102 may gradually decrease. That is, the dimension of the fin structure 102 along a direction perpendicular to the length direction of the fin structure 102 and parallel to the surface of the base structure may become smaller along a direction perpendicular from the bottom to the top of the fin structure 102.

The Fin-FET device may also include a gate structure formed on the base structure across the fin structure 102. The gate structure may cover a portion of the top and the sidewall surfaces of the fin structure 102.

The Fin-FET device may further include a trench formed in the fin structure 102 on each side of the gate structure. Along the length direction of the fin structure 102, the bottom width of each trench may be larger than the top width of the trench.

The Fin-FET device may also include a doped source/drain epitaxial layer 105 formed in each trench. The doped source/drain epitaxial layer 105 may fill up the corresponding trench in the fin structure 102. The doped source/drain epitaxial layer 105 may be doped with P-type ions or N-type ions.

Moreover, the base structure may further include a substrate 101 and an isolation structure 103 formed on the substrate 101. The plurality of fin structures 102 may be formed on the substrate 101. The isolation structure 103 may cover a portion of the sidewall surfaces of each fin structure 102, and the top surface of the isolation structure 103 may be lower than the top surfaces of the fin structures 102. The isolation structure 103 may electrically isolate neighboring fin structures 102.

In one embodiment, along a direction perpendicular to the length direction of the fin structure 102, the bottom width of the fin structure 102 may be larger than the top width of the fin structure 102. Therefore, each sidewall surface of the fin structure 102 may be a tilted surface.

The gate structure may be formed on the isolation structure. The gate structure may further include a gate dielectric layer 111 and a gate electrode layer 112 formed on the gate dielectric layer 111. The detailed description of the gate dielectric layer 111 and the gate electrode layer 112 may refer to the corresponding content in various embodiments illustrated above.

In one embodiment, a hard mask layer 113 may cover the top surface of the gate electrode layer 112. The hard mask layer 113 may provide protection for the top surface of the gate electrode layer 112.

Further, along the direction perpendicular to the surface of the base structure and parallel to the length direction of the fin structure 102, the cross section of each trench may have a reversed trapezoid shape, and accordingly, along the direction perpendicular to the surface of the base structure and parallel to the length direction of the fin structure 102, the cross section of each doped source/drain epitaxial layer 105 may also have a reversed trapezoid shape. In other embodiment, along the direction perpendicular to the surface of the base structure and parallel to the length direction of the fin structure 102, the cross section of each trench may have a reversed triangle shape, and accordingly, along the direction perpendicular to the surface of the base structure and parallel to the length direction of the fin structure 102, the cross section of each doped source/drain epitaxial layer 105 may also have a reversed triangle shape.

Moreover, a doped source/drain epitaxial layer 105 formed on one side of the gate structure may be used as a source region, and accordingly, another doped source/drain epitaxial layer 105 formed on the other side of the gate structure may be used as a drain region. When the Fin-FET device to be formed in an NMOS device, the doped source/drain epitaxial layer 105 may be made of Si or SiC and doped with N-type ions. The N-type ions may include one or more of P ions, As ions, and Sb ions. When the Fin-FET device to be formed in a PMOS device, the doped source/drain epitaxial layer 105 may be made of Si or SiGe and doped with P-type ions. The P-type ions may include one or more of B ions, Ge ions, and In ions.

Along the length direction of the fin structure, a second width W2 between the tops of the two doped source/drain epitaxial layers 105 may be smaller than a first width W1 between the bottoms of the two doped source/drain epitaxial layers 105.

In one embodiment, along the direction perpendicular to the surface of the base structure and from the bottom to the top of each trench, the width of the fin structure 102 may gradually decrease. That is, in the direction perpendicular to the length direction of the fin structure 102 and parallel to the surface of the substrate 101, the width of the fin structure 102 at the top of the trench 104 may be smaller than the width of the fin structure 102 at the bottom of the trench 104. In addition, along the direction perpendicular to the surface of the base structure and from the bottom to the top of each trench, the dimension of the trench in the length direction of the fin structure 102 may gradually increase.

Because in the region between the tops of adjacent doped source/drain epitaxial layers 105, the width of the fin structure 102, i.e. the dimension of the fin structure 102 along the direction perpendicular to the length direction of the fin structure 102, is relatively small, the ability of the gate structure to control the fin structure 102 (i.e. channel region) with such a small width may be strong. Therefore, a moderately small second width W2 between the tops of the two adjacent doped source/drain epitaxial layers 105 may not cause significant SCE. In addition, the relatively small second width W2 between the tops of the two adjacent doped source/drain epitaxial layers 105 may also be conducive to improving the driving current for the Fin-FET device.

Because in the region between the bottoms of adjacent doped source/drain epitaxial layers 105, the width of the fin structure 102, i.e. the dimension of the fin structure 102 along the direction perpendicular to the length direction of the fin structure 102, is relatively large, the ability of the gate structure to control the fin structure 102 (i.e. channel region) with such a small width may be weak. However, because the first width W1 between the bottoms of the two adjacent doped source/drain epitaxial layers 105 is relatively large, the effective channel length in the channel region corresponding to the bottoms of the doped source/drain epitaxial layers 105 may be increased. Therefore, the insufficient ability of the gate structure in controlling the channel region may be compensated, and thus, the SCE in the Fin-FET device may be suppressed.

Further, along the direction perpendicular to the surface of the base structure and from the top to the bottom of the fin structure 102, the distance between two adjacent doped source/drain epitaxial layers 105 may gradually increase. Accordingly, along the direction perpendicular to the surface of the base structure and from the top to the bottom of the fin structure 102, the effective channel length of the channel region under the gate structure may gradually increase, balancing the problems caused by the gradually weakened ability of the gate structure in controlling the channel region. As such, the SCE in the Fin-FET device may be suppressed.

Compared to existing fabrication methods and Fin-FET devices, the disclosed fabrication methods and Fin-FET devices may demonstrate several advantages.

According to the disclosed fabrication methods, along a direction perpendicular to the surface of the base structure and from the bottom to the top of the fin structure, the width of the fin structure (i.e., the dimension of the fin structure in the direction perpendicular to the length direction of the fin structure and parallel to the surface of the base structure) gradually decreases. Accordingly, the ability of the gate structure to control the channel region in the fin structure also gradually decreases. Moreover, during the etching process to remove a portion of the fin structure and thus form a trench on each side of the gate structure, the bottom width of the formed trench along the length direction of the fin structure is smaller than the top width of the trench. Further, each trench is then filled by a doped source/drain epitaxial layer. Because the distance between the tops of adjacent doped source/drain epitaxial layers is relatively small, the Fin-FET device may have a relatively high driving current. In addition, because the distance between the bottoms of adjacent doped source/drain epitaxial layers is relatively large, the effective channel length corresponding to the bottoms of the doped source/drain epitaxial layers increases. As such, the effects due to the weak ability of the gate structure in controlling the channel region that corresponds to the bottoms of the doped source/drain epitaxial layers may be compensated, the SCE may be reduced, and the DIBL effect may also be suppressed. Therefore, the electrical performance of the formed Fin-FET device is improved.

Moreover, according to the disclosed fabrication methods and Fin-FET devices, after forming the doped source/drain epitaxial layers, a doping process may be further performed on the doped source/drain epitaxial layers. The doping process may be conducive to reducing the contact resistance at the surface of the doped source/drain epitaxial layers and may also further improve the doping concentration in the source/drain epitaxial layers. In addition, the doping depth of the doping process is smaller than or equal to ⅓ of the depth of the corresponding trench such that the boundaries of the source region and the drain region may not be affected, which may ensure that the boundaries of the source region and the drain region are still defined by the originally-formed doped source/drain epitaxial layers.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (Fin-FET) device, comprising:
   providing a base structure and a plurality of fin structures protruding from the base structure, wherein along a direction perpendicular to a surface of the base structure and from a bottom to a top of each fin structure, a width of the fin structure perpendicular to a length direction of the fin structure decreases;
   forming a gate structure on the base structure across each fin structure and covering a portion of top and sidewall surfaces of the fin structure;
   forming a mask layer on the top and the sidewall surfaces of each fin structure, sidewall surfaces of each gate structure, and the base structure, wherein the mask layer exposes a portion of the top surface of the fin structure on each side of the gate structure;
   removing a portion of the fin structure on each side of the gate structure to form a trench in the fin structure, wherein:
      a top edge of the trench abuts a surface of a portion of the mask layer on the sidewall surfaces of the gate structure, and
      along the length direction of the fin structure, a bottom width of the trench is smaller than a top width of the trench; and
   filling each trench with a doped source/drain epitaxial layer.

2. The method for fabricating the Fin-FET device according to claim 1, wherein:
   the doped source/drain epitaxial layer is formed by a selective epitaxial process.

3. The method for fabricating the Fin-FET device according to claim 2, wherein:
   the selective epitaxial process to form the doped source/drain epitaxial layer includes in-situ doping of P-type ions or N-type ions.

4. The method for fabricating the Fin-FET device according to claim 1, wherein:
   along a direction perpendicular to the surface of the base structure and from a bottom to a top of each trench, a width of the trench in the length direction of the fin structure gradually increases.

5. The method for fabricating the Fin-FET device according to claim 4, wherein:
   along the direction perpendicular to the surface of the base structure and from the bottom to the top of each trench, a cross section of the trench has a reversed trapezoid shape.

6. The method for fabricating the Fin-FET device according to claim 4, wherein:
   along the direction perpendicular to the surface of the base structure and from the bottom to the top of each trench, a cross section of the trench has a reversed triangle shape.

7. The method for fabricating the Fin-FET device according to claim 1, wherein:
   when the Fin-FET is an N-type metal-oxide-semiconductor (NMOS) device, the doped source/drain epitaxial layer is made of Si or SiC and doped with N-type ions; and when the Fin-FET is a P-type metal-oxide-semiconductor (PMOS) device, the doped source/drain epitaxial layer is made of Si or SiGe and doped with P-type ions.

8. The method for fabricating the Fin-FET device according to claim 1, prior to forming the doped source/drain epitaxial layer, further including:
forming an epitaxial seed layer on bottom and sidewall surfaces of each trench through a selective epitaxial process.

9. The method for fabricating the Fin-FET device according to claim 1, wherein forming the trench on each side of the fin structure further includes:
forming an initial mask layer on the top and the sidewall surfaces of each fin structure, the top and sidewall surfaces of each gate structure, and the base structure;
forming a patterned layer on the initial mask layer with the patterned layer exposing the initial mask layer formed on a portion of the top surface of the fin structure on each side of the gate structure;
etching the exposed portion of the initial mask layer and a portion of the fin structure using the patterned layer as a mask to form the trench; and
removing the patterned layer.

10. The method for fabricating the Fin-FET device according to claim 1, wherein:
etching the portion of the fin structure on each side of the gate structure to form the trench includes performing a dry etching process, a wet etching process, or a combination thereof.

11. The method for fabricating the Fin-FET device according to claim 1, wherein the base structure includes a substrate and an isolation structure formed on the substrate, and wherein:
the fin structures are formed on the substrate;
the isolation structure covers a portion of sidewall surfaces of each fin structure; and
a top surface of the isolation structure is lower than the top surface of the fin structure.

12. A method for fabricating a fin field-effect transistor (Fin-FET) device, comprising:
providing a base structure and a plurality of fin structures protruding from the base structure, wherein along a direction perpendicular to a surface of the base structure and from a bottom to a top of each fin structure, a width of the fin structure perpendicular to a length direction of the fin structure decreases;
forming a gate structure on the base structure across each fin structure and covering a portion of top and sidewall surfaces of the fin structure;
removing a portion of the fin structure on each side of the gate structure to form a trench in the fin structure, wherein along the length direction of the fin structure, a bottom width of the trench is smaller than a top width of the trench;
filling each trench with a doped source/drain epitaxial layer; and
after forming the doped source/drain epitaxial layer, performing a doping process on the doped source/drain epitaxial layer, wherein a type of doping ions used in the doping process is a same type of doping ions in the doped source/drain epitaxial layer.

13. The method for fabricating the Fin-FET device according to claim 12, wherein:
a doping depth of the doping process is less than or equal to ⅓ of a depth of the trench.

14. The method for fabricating the Fin-FET device according to claim 12, further including:
performing an annealing process after the doping process performed on the doped source/drain epitaxial layer.

15. The method for fabricating the Fin-FET device according to claim 12, wherein:
along a direction perpendicular to the surface of the base structure and from a bottom to a top of each trench, a width of the trench in the length direction of the fin structure gradually increases.

16. The method for fabricating the Fin-FET device according to claim 15, wherein:
along the direction perpendicular to the surface of the base structure and from the bottom to the top of each trench, a cross section of the trench has a reversed trapezoid shape.

17. The method for fabricating the Fin-FET device according to claim 15, wherein:
along the direction perpendicular to the surface of the base structure and from the bottom to the top of each trench, a cross section of the trench has a reversed triangle shape.

18. The method for fabricating the Fin-FET device according to claim 12, wherein:
when the Fin-FET is an N-type metal-oxide-semiconductor (NMOS) device, the doped source/drain epitaxial layer is made of Si or SiC and doped with N-type ions; and
when the Fin-FET is a P-type metal-oxide-semiconductor (PMOS) device, the doped source/drain epitaxial layer is made of Si or SiGe and doped with P-type ions.

19. The method for fabricating the Fin-FET device according to claim 12, prior to forming the doped source/drain epitaxial layer, further including:
forming an epitaxial seed layer on bottom and sidewall surfaces of each trench through a selective epitaxial process.

* * * * *